United States Patent [19]
Ellison et al.

[11] Patent Number: 6,026,221
[45] Date of Patent: Feb. 15, 2000

[54] PROTOTYPING MULTICHIP MODULE

[75] Inventors: John J. Ellison, Wappingers Falls; Dennis Felix Clocher, Milton; Joseph John Lisowski, Hopewell Junction; Joseph L. Temple, Hurley; Michael G. Nealon, Peekskill, all of N.Y.

[73] Assignee: International Business Machines Corporation, Armonk, N.Y.

[21] Appl. No.: 09/025,671

[22] Filed: Feb. 18, 1998

[51] Int. Cl.[7] .............................. G06F 1/16; H05K 3/40; H01L 27/06
[52] U.S. Cl. ................. 395/500.05; 395/500.06; 174/261; 174/737
[58] Field of Search ............................ 395/500.5, 500.6; 174/260, 261; 361/777; 257/686; 365/51, 63

[56] References Cited

U.S. PATENT DOCUMENTS

| | | |
|---|---|---|
| 4,489,364 | 12/1984 | Chance et al. . |
| 4,730,232 | 3/1988 | Lindberg . |
| 5,187,020 | 2/1993 | Kwon et al. . |
| 5,243,140 | 9/1993 | Bhatia et al. . |
| 5,262,719 | 11/1993 | Magdo . |
| 5,354,955 | 10/1994 | Gregor et al. . |
| 5,371,390 | 12/1994 | Mohsen . |
| 5,396,032 | 3/1995 | Bonham, Jr. et al. . |
| 5,414,637 | 5/1995 | Bertin et al. . |
| 5,424,589 | 6/1995 | Dobbelaere et al. ................ 326/41 |
| 5,438,513 | 8/1995 | Borkowicz et al . |
| 5,477,160 | 12/1995 | Love . |
| 5,528,462 | 6/1996 | Pendse . |
| 5,665,989 | 9/1997 | Dangelo ................................ 257/210 |
| 5,754,410 | 5/1998 | Bardsley et al. .................... 361/777 |
| 5,763,947 | 6/1998 | Bartley ................................ 257/701 |
| 5,895,230 | 4/1999 | Bartley .................................... 438/4 |
| 5,905,383 | 5/1999 | Frisch .................................. 324/765 |

OTHER PUBLICATIONS

U.S. Ser. No. 08/710131, now 5754410, issued to T. Bardsley et al. on Sep. 11, 1996.

*Primary Examiner*—Kevin J. Teska
*Assistant Examiner*—Lonnie A. Knox
*Attorney, Agent, or Firm*—DeLio & Peterson, LLC; Robert Curcio; Aziz M. Ahsan

[57] ABSTRACT

A pre-production, prototype multi-chip module adapted for preliminary performance timing and functional tests includes a plurality of chips attached to a substrate. Multiple nets are embedded within the substrate connecting the chips. A layer over the substrate encapsulates the chips. Production input/output pins on the substrate are connected to the chips. An area on the upper surface of the module is not covered by the encapsulating layer, which contains upper pads adapted for connection of a second module containing spare circuits to the substrate, wherein the upper pads are connected to the at least one net. Some of the upper pads have connections to each other near the surface of the encapsulating layer, wherein the connections are adapted to be severed for connecting a second module containing spare circuits to one or more of the chips.

17 Claims, 1 Drawing Sheet

PROTOTYPING MULTICHIP MODULE

BACKGROUND OF THE INVENTION

1. Field of the Invention

The present invention relates to prototypes for production of multi-chip modules capable of carrying several integrated circuit chips in a single multi-layer ceramic package, and, in particular, to a pre-production, prototype multi-chip module adapted for preliminary performance timing and functional tests and method of making the same.

2. Description of Related Art

A multi-chip module (MCM) is a module or package capable of supporting several chips on a single package. Most multichip packages are made of multiple layers of ceramic in which the chips are connected by nets formed by conductors in the ceramic layers or extended through holes (vias) between the layers. MCM's are currently used in applications requiring high performance such as frequencies of 200 MHz or more.

There has been a long felt need for a pre-production, prototype MCM which can be used for timing as well as functional verification. Typically, MCM's are prototyped with circuit board containing single chip modules (SCM). In order to run at near operational speeds, these prototyped circuit boards are typically implemented as printed circuits. Although these prototype boards are more useful than the prior yellow wire boards, the prototyped printed circuit boards have considerably higher design and fabrication expense. Additionally, the electrical path length of signals on the prototype boards may prevent use of the boards as means of verifying timing of the various circuit, as well as testing whether the circuits and chips are functional.

Bearing in mind the problems and deficiencies of the prior art, it is therefore an object of the present invention to provide a pre-production, prototype multichip module which is adapted for performance timing and functional tests of production modules.

It is another object of the present invention to provide a process for producing such a pre-production prototype module which does not distort timing so as to prevent use of the module for preliminary performance testing.

A further object of the invention is to provide a method for determining the impact of the test circuits in a preproduction prototype board which minimizes impact to timing as compared to the production board.

SUMMARY OF THE INVENTION

The above and other objects and advantages, which will be apparent to one of skill in the art, are achieved in the present invention which is directed to, in a first aspect, a pre-production, prototype multi-chip module adapted for preliminary performance timing and functional tests. The prototype module includes a plurality of chips attached to a substrate. At least one net is embedded within the substrate connecting the chips. A layer over the substrate encapsulates the chips. Production input/output pins on the substrate are connected to the chips. An area on the upper surface of the module is not covered by the encapsulating layer. This area contains upper pads adapted for connection of a second module containing spare circuits to the substrate, wherein the upper pads are connected to the at least one net.

At least some of the upper pads may have connections to each other near the surface of the encapsulating layer, wherein the connections are adapted to be severed for connecting a second module containing spare circuits to one or more of the chips.

Another module containing spare circuits may be connected to the upper pads. There may be further included in the prototype module additional layers in the substrate containing wiring not required for the at least one net. Lower pads may be included on a lower surface of the module connected to the upper pads and the at least one net.

In a further aspect, the present invention provides a method for producing a pre-production, prototype multi-chip module adapted for preliminary performance timing and functional tests. A physical design is created of a preproduction, prototype multi-chip module. Engineering change and probe nets in the design are then identified. The engineering change and probe nets in the design are prioritized by critical timing, for example, using a timing analysis tool, to determine if the nets may be utilized for an engineering change connection. The engineering change and probe nets in the design are prioritized by importance of prototyping to determine if the nets must be available for an engineering change connection. Features on the pre-production, prototype multi-chip module are created based on the above priorities.

In another aspect, the present invention relates to a method for producing a pre-production, prototype multi-chip module adapted for preliminary performance timing and functional tests. First, there is provided a substrate adapted to receive a plurality of chips, a plurality of nets embedded within the substrate for connecting the chips, and production input/output pins on the substrate for connection to the chips. At least one of the nets is identified as having the highest priority with respect to timing or function or both, for example, by the method described in the preceding paragraph. First and second connectors are provided between one surface of the substrate and the net. The net has no direct connection embedded in the substrate between the first and second connectors. Finally, a third connector is provided connecting the first and second connectors near the one surface of the substrate.

A production, multi-chip module may be created by producing a pre-production, prototype multi-chip module in accordance with the aforementioned methods, and then producing a production multi-chip module utilizing the design of the pre-production, prototype multi-chip module except for the first, second and third connectors.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

Figure 1:
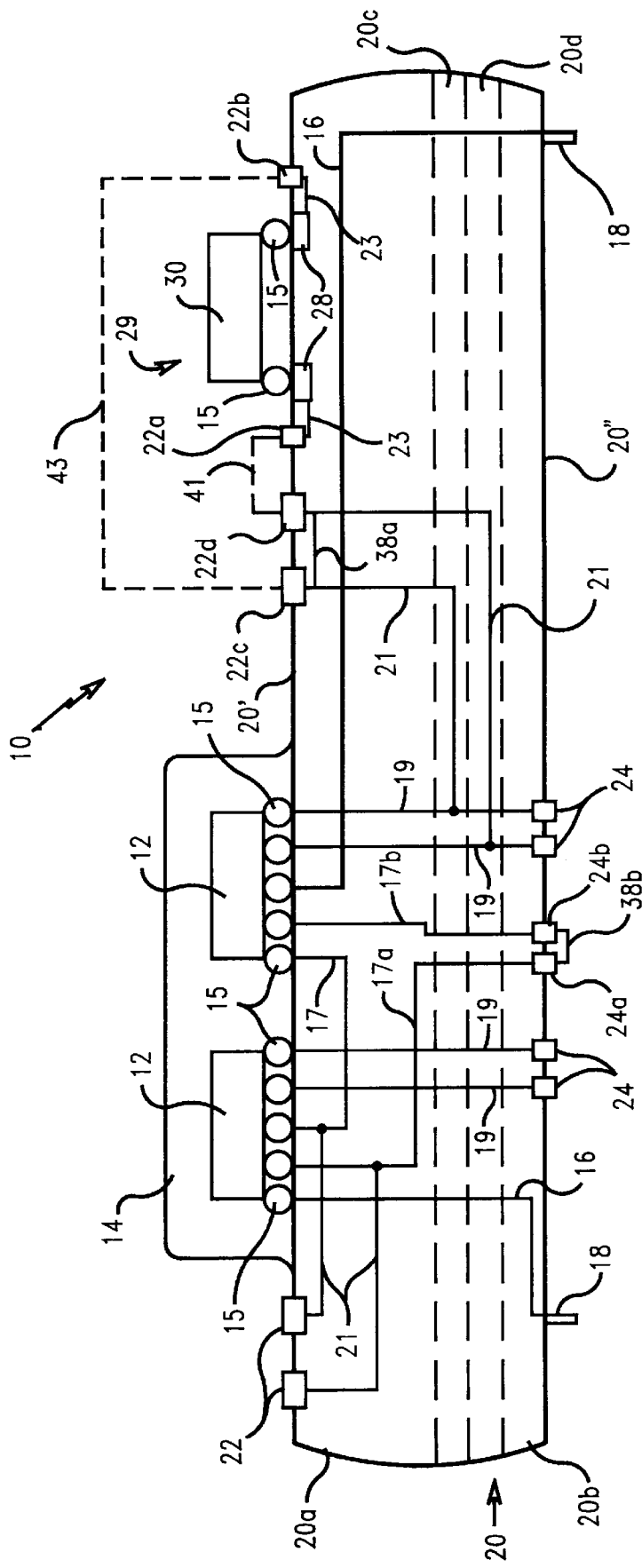
FIG. 1 is a side elevational view of a preferred pre-production, prototype multi-chip module adapted for preliminary performance timing and functional tests in accordance with the present invention.

DESCRIPTION OF THE PREFERRED
EMBODIMENT(S)

In describing the preferred embodiment of the present invention, reference will be made herein to the drawings in which like numerals refer to like features of the invention. Features of the invention are not necessarily shown to scale in the drawings.

A preferred preproduction, prototype multichip module adapted for preliminary performance timing and functional tests is shown in FIG. 1. The module 10 comprises a substrate 20 made up of upper and lower ceramic layers 20a, 20b, respectively, which have thereon upper and lower surfaces 20', 20", respectively. Mounted on upper substrate surface 20' are a plurality of integrated circuit chips 12 electrically connected thereto by solder balls, solder columns, C4s or other connectors 15. Internal connection within substrate 20 are provided by conventional means such as vias for layer to layer connection and metal lines for connection within layers.

In accordance with production requirements, chips 12 are hermetically sealed on the surface of substrate 20 by encapsulating layer 14, which may be any well known encapsulate such as a polymer which is applied to and cured over chips 12. Chips 12 are connected to each other by a net 17. As used herein, the term "net" refers to the electrical connector used to connect a group of terminals which have common DC electrical potential and an electrical component package. To connect the prototype MCM to the component in which it is to be used, a plurality of production pins 18 are connected by conductors 16 to the various chips in the module 10. As used herein, the term "pin" refers to pins, solder balls, solder columns or other connectors used in production versions of multichip modules to provide input and/or output signals to and from the multi-chip module. Such pins may be also used to provide supply or references voltages in ground potential. The pins should be laid out so as to be compatible with pin locations in the final production board.

In accordance with the present invention, there is provided an area 29 on upper surface 20' of chip 20 outside of encapsulating layer 14 which is adapted to receive an external ASIC (application specific integrated circuit), PAL (program array logic) or other chip, or which provide extra circuitry for connection to and/or modification of encapsulated chips 12. Upper probe points or pads 28 are provided for receiving connectors 15 on extra circuit 30. Internal connectors 23 connect pads 28 to upper pads 22 which are accessible from above substrate 20 and external to encapsulating layer 14. Preferably, the probe points or pads employed herein may have a variety of shapes and sizes. If the capacitance of a specific circuit is not critical and relatively small number of pads is being used, the pads may be configured to have a relatively large size to facilitate targeting and contact by a testing probe. If, however, capacitance of a specific surface is critical, then the corresponding pads should be relatively small. The pads may be gold plated to facilitate conductive contact with probing devices and provide a reliable contact surface. However, such gold plating may not be necessary and other types of metals may be used for the pads or for plating the pads. To facilitate testing of chips 12, internal circuits 19 may be provided between chip connectors 15 and lower pads 24 mounted on the lower surface 20' of substrate 20. Such internal conductors 19 may be also connected by conductors 21 to pads 22a, 22b mounted on the upper surface 20' of the substrate. Conductors 21 themselves are partially within extra substrate layers 20c, 20d which are provided for such extra circuitry. Such pads and internal connectors provide access to testing of the chips mounted within encapsulant 14. The extra layers 20c, 20d only minimally impact production design.

To facilitate engineering changes to the internal circuitry within and between chips 12, engineering change (EC) connectors may be provided. An example of an EC connector between connectors of a single chip 12 is shown as pads 22c, 22d which have an EC connector 38a near the surface 20' of the substrate. An example of another engineering change connector used in a net between different chips 12 is between external lower pads 24a, 24b which are connected by net segment 17a, 17b to the respective chips. An EC connector 38b is provided between pads 24a, 24b on lower surface 20' of substrate 20. In the event that an engineering change is to be made in these particular nets, EC connectors 38a, 38b may be severed, for example, by laser or mechanical means, and the respective pads 22c, 22d or 24a, 24b may be connected to other circuitry external to the encapsulated chips 12 and module 10.

An example of an engineering change made to module 10 is shown by electrical connector 41, which connects pad 22a to pad 22d, and electrical connector 43, which connects pad 22b to pad 22c. In the event of such engineering change, connector 38a will be severed to permit chip 30 to be connected to chips 12.

In designing and manufacturing the preproduction multi-chip module of the present invention, a tradeoff must be made between bringing enough pins out to EC connectors and probe pads on one hand, and incorporating too many of such connectors and pads so as to distort timing and prevent use of the module for preliminary performance testing on the other hand. To minimize such timing distortion, the preproduction MCM module of the present invention utilizes the following procedure:

1. The production module preliminary physical design is initially carried out.
2. EC and probe nets are identified. This is done by assessing the design and determining the probability of a design error, or the likelihood of needing a monitor point on any given net. For example, it would be much more likely that a control function would need to be modified than a data path.
3. EC and probe nets are prioritized by critical timing. In this step, it is required that the designer understand the timing constraints for any net that possibly could be used for an EC. The initial judgment would come from general design knowledge and later confirmed by using a timing analysis tool. This assessment would allow the designer to know how much slack is in a particular net and if it could be used for an EC connection.
4. EC and probe nets are prioritized by importance by prototyping. Not all nets are given equal weight. Some nets (such as function nets) can be worked around, or even ignored (such as some error circuitry) at the functional level. The designer needs to identify those nets that must be available for a potential EC, as contrasted with those that may not be as critical for the module operation.
5. A consolidated priority list is generated.
This list summarizes, by priority, the above steps 1–4.
This list then becomes the input for step 6, below.
6. Prototyping features are added based on the consolidated list. The list from the previous step 5 is used to target the key nets (either because of functional need or due to timing limitations, or both), such that the prototyping layout can be logically directed, based on the timing and function criteria.

Also, in accordance with the present invention, the impact of the EC connector and probe circuits on timing of the various chips and processes may be minimized. Initially, one starts with the highest priority EC net which is determined by the above procedure. Then two vias are located which can reach the same surface layer at or near the net. This can be facilitated by reserving a certain number of vias during initial production design. Critical nets can override the reservations, or this can be added to the EC priority list. Then the net is connected to the first via with the shortest possible internal connection or trace and the net is connected to the second vias also with the shortest possible internal connection or trace. Then the trace is removed between the two vias, and the two vias are connected on the surface layer. Then the procedure is repeated for the next EC net in the priority list.

As a result of the present invention, EC capability is only added to the prototype and does not have to be added to the production model as has been done in the prior art. Because of this, a cost reduction is realized in the production module. Additionally, there are engineering savings in that the prototype board and MCM substrates do not have to be designed, as well.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A pre-production, prototype multi-chip module adapted for preliminary performance timing and functional tests comprising:

a plurality of chips attached to a substrate, at least one net embedded within said substrate connecting said chips, a layer over said substrate encapsulating said chips and production input/output pins on said substrate connected to said chips; and an area on said upper surface of said module not covered by the encapsulating layer containing upper pads adapted for connection of a second module containing spare circuits to said substrate, said upper pads being connected to said at least one net.

2. The module of claim 1 further including additional layers in said substrate containing wiring not required for said at least one net.

3. The module of claim 2 further including lower pads on a lower surface of said module connected to said upper pads and said at least one net.

4. The module of claim 3 further including a second module containing spare circuits connected to said upper pads.

5. The module of claim 1 wherein at least some of said upper pads having connections to each other near the surface of said encapsulating layer, said connections adapted to be severed for connecting a second module containing spare circuits to one or more of said chips.

6. A pre-production, prototype multi-chip module adapted for preliminary performance timing and functional tests comprising:

a plurality of chips attached to a substrate, at least one net embedded within said substrate connecting said chips, a layer over said substrate encapsulating said chips and production input/output pins on said substrate connected to said chips;

an area on said upper surface of said module not covered by the encapsulating layer containing upper pads adapted for connection of a second module containing spare circuits to said substrate, said upper pads being connected to said at least one net; and a second module containing spare circuits connected to said upper pads.

7. The module of claim 6 further including lower pads on a lower surface of said module connected to said upper pads and said at least one net.

8. The module of claim 6 wherein at least some of said upper pads having connections to each other near the surface of said encapsulating layer, said connections adapted to be severed for connecting a third module containing spare circuits to one or more of said chips.

9. A pre-production, prototype multi-chip module adapted for preliminary performance timing and functional tests comprising:

a plurality of chips attached to a substrate, at least one net embedded within said substrate connecting said chips, a layer over said substrate encapsulating said chips and production input/output pins on said substrate connected to said chips; and an area on said upper surface of said module not covered by the encapsulating layer containing upper pads adapted for connection of a second module containing spare circuits to said substrate, said upper pads being connected to said at least one net, and lower pads on a lower surface of said module opposite said upper surface, said lower pads being connected to said upper pads and said at least one net.

10. The module of claim 9 wherein at least some of said upper pads having connections to each other near the surface of said encapsulating layer, said connections adapted to be severed for connecting a second module containing spare circuits to one or more of said chips.

11. The module of claim 10 further including additional layers in said substrate containing wiring not required for said at least one net.

12. The module of claim 11 further including a third module containing spare circuits connected to said upper pads.

13. A method for producing a pre-production, prototype multi-chip module adapted for preliminary performance timing and functional tests comprising the steps of:

a) providing a substrate adapted to receive a plurality of chips, a plurality of nets embedded within said substrate for connecting said chips, and production input/output pins on said substrate for connection to said chips;

b) identifying at least one of said nets having the highest priority;

c) providing first and second connectors between one surface of said substrate and said net, said net having no direct connection embedded in said substrate between said first and second connectors; and d) providing a third connector connecting said first and second connectors near said one surface of said substrate.

14. A method for producing a pre-production, prototype multi-chip module adapted for preliminary performance timing and functional tests comprising the steps of:

a) creating a physical design of a pre-production, prototype multi-chip module;

b) identifying engineering change and probe nets in said design;

c) prioritizing said engineering change and probe nets in said design by critical timing to determine if said nets may be utilized for an engineering change connection;

d) prioritizing said engineering change and probe nets in said design by importance of prototyping to determine if said nets must be available for an engineering change connection;

e) creating prototyping features on said pre-production, prototype multi-chip module based on the priorities of steps (d) and (e).

15. The method of claim 14 wherein said step (c) of prioritizing said engineering change and probe nets in said design by critical timing includes utilizing a timing analysis tool.

16. The method of claim 14 wherein step (e) comprises:

e1) providing a substrate adapted to receive a plurality of chips, a plurality of nets embedded within said substrate for connecting said chips, and production input/output pins on said substrate for connection to said chips;

e2) identifying at least one of said nets having the highest priority in accordance with steps (c) and (d);

e3) providing first and second connectors between one surface of said substrate and said net identified in step (e2), said net having no direct connection embedded in said substrate between said first and second connectors; and e4) providing a third connector connecting said first and second connectors near said one surface of said substrate.

17. A method for producing a production, multi-chip module comrising the steps of:

a) producing a pre-production, prototype multi-chip module in accordance with the method of claim 14;

b) producing a production multi-chip module utilizing the design of said pre-production, prototype multi-chip module except for said first, second and third connectors.

* * * * *